United States Patent
Strange et al.

[19]

[11] Patent Number: 6,062,872
[45] Date of Patent: May 16, 2000

[54] HIGH SPEED BACKPLANE CONNECTOR

[75] Inventors: Andrew H. Strange, Collierville, Tenn.;
Wayne S. Alden, III, Whitman, Mass.

[73] Assignee: Thomas & Betts International, Inc., Sparks, Nev.

[21] Appl. No.: 09/272,840

[22] Filed: Mar. 19, 1999

Related U.S. Application Data

[60] Provisional application No. 60/079,008, Mar. 23, 1998.

[51] Int. Cl.[7] .................................................. H01R 9/09
[52] U.S. Cl. ......................... 439/67; 439/248; 439/247; 439/289
[58] Field of Search .................................... 439/247, 248, 439/67, 79, 289, 65, 86

[56] References Cited

U.S. PATENT DOCUMENTS

| | | | |
|---|---|---|---|
| 4,881,901 | 11/1989 | Mendenhall et al. | 439/65 |
| 5,102,342 | 4/1992 | Marian | 439/65 |
| 5,184,961 | 2/1993 | Ramirez et al. | 439/59 |
| 5,205,739 | 4/1993 | Malo et al. | 439/66 |
| 5,989,037 | 11/1999 | Ruque | 439/61 |

*Primary Examiner*—Lincoln Donovan
*Assistant Examiner*—Richard K. Lee
*Attorney, Agent, or Firm*—Weingarten, Schurgin, Gagnebin & Hayes LLP

[57] ABSTRACT

A high-speed connector for interconnecting circuit boards to a backplane or interconnecting a mother board to daughter board. The connector includes a housing, biasing elements, a flex film, conductive elastomeric contact modules and biasing modules. The conductive elastomeric contact modules comprise a substrate which includes a plurality of individual conductive elastomeric contacts such as Metallized Particle Interconnect (MPI), or a polymer containing a plurality of conductive particles disposed therein. The first side of the conductive elastomeric contact modules interface to the flex film, and the second side of the conductive elastomeric contact module interface to a printed circuit board (PCB) set of contacts. Alternately, the conductive elastomeric contacts could be molded directly onto the flex film to eliminate the conductive elastomeric contact modules. The flex film includes conductive traces for providing electrical communication from a first conductive elastomeric contact module to a second conductive elastomeric contact module. The flex film could be realized as a multi-layer film and include ground planes and/or strip line traces. Further, the conductive elastomeric contact modules could also include power and ground contacts.

21 Claims, 4 Drawing Sheets

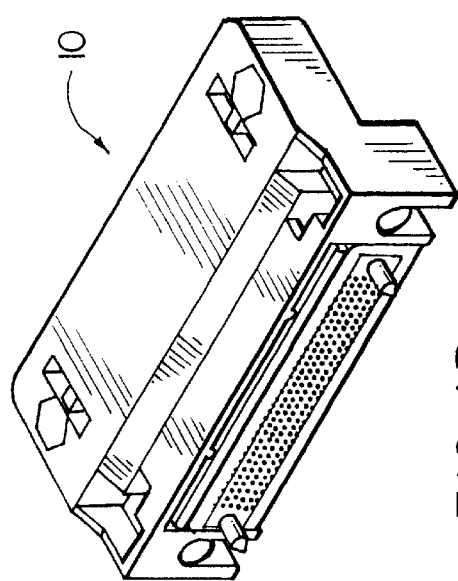
FIG. ID
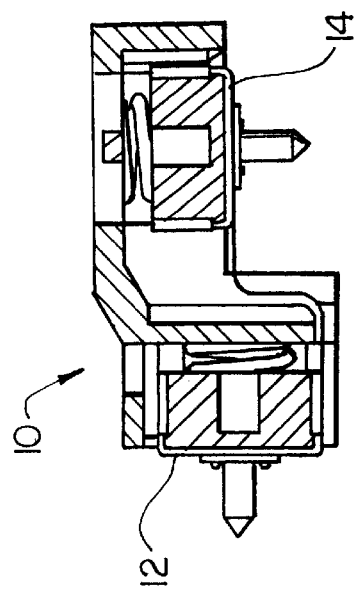
FIG. IE
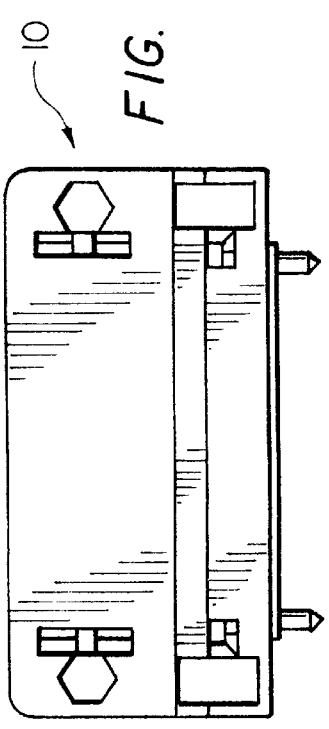
FIG. IA
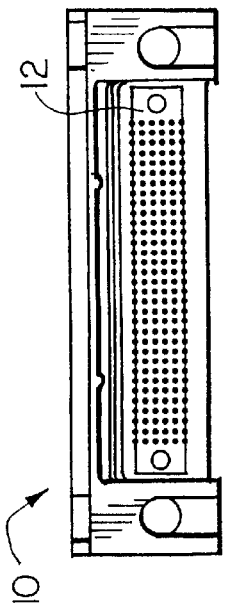
FIG. IB
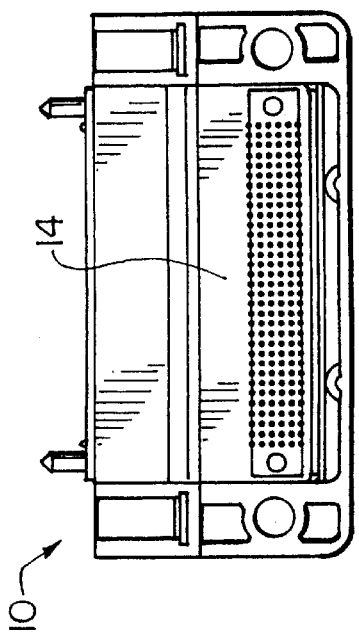
FIG. IC

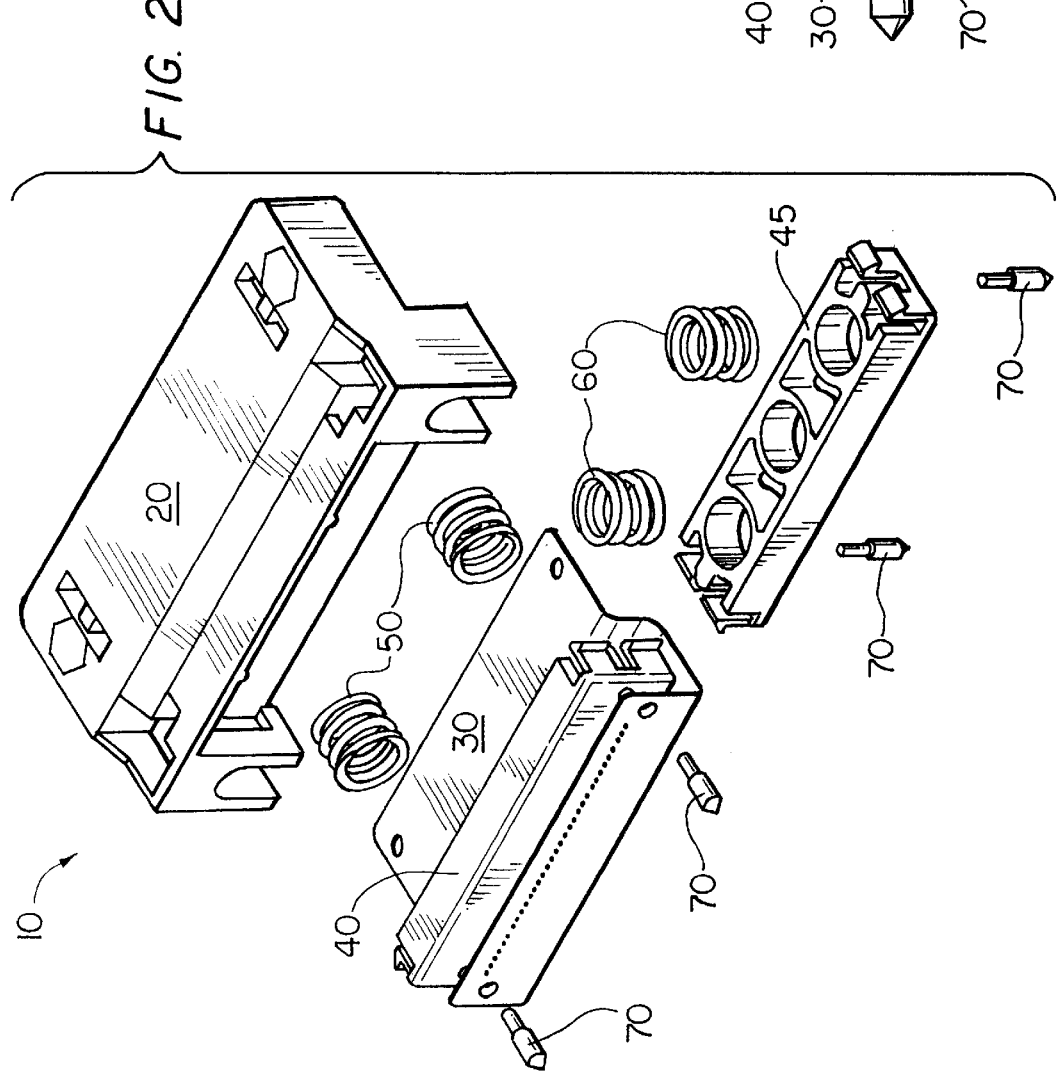

HIGH SPEED BACKPLANE CONNECTOR

CROSS REFERENCE TO RELATED APPLICATIONS

This application claims priority under 35 U.S.C. § 119(e) to provisional patent application Ser. No. 60/079,008 filed Mar. 23, 1998; the disclosure of which is incorporated herein by reference.

STATEMENT REGARDING FEDERALLY SPONSORED RESEARCH OR DEVELOPMENT

Not Applicable

BACKGROUND OF THE INVENTION

A variety of backplane connectors are known in the art. As connection densities increase there is a demand to provide a reliable manner of interconnecting a large number of densely organized printed circuit boards pads to a connector of minimal size while still providing a high degree of reliability. Prior attempts at providing such a connector having a large number of interconnects in a small amount of space have included connectors that incorporate a housing module secured to a first printed circuit board and a stiffener module secured to a second printed circuit board. Other attempts have provided a connector that permits parallel interconnect for interconnecting two circuit boards in parallel planes. These connectors require multiple parts making manufacture and assembly of the connectors difficult and time consuming. Further, these type of connectors suffer from stresses applied to the connectors from insertion of the connector to a mating printed circuit board which reduces the reliability of the connector. These connectors also must provide proper alignment of the connector interconnect to the densely arranged pads of the circuit board in order to provide a high degree of reliability. It would be desirable to provide a connector which is easily installed and/or removed from a circuit board, which provides a high number of interconnections between two printed circuit boards which are generally perpendicular with each other while taking up a minimal amount of space, which minimizes the stresses applied to the connector interconnect during installation of the connector to a second printed circuit board, which is easily aligned with the pads of the printed circuit board, and which provides a reliable interconnection between two printed circuit boards.

BRIEF SUMMARY OF THE INVENTION

A high-speed connector for interconnecting circuit boards to a backplane or interconnecting a mother board to daughter board is disclosed. The connector includes a housing, a plurality of biasing elements, a flex film, conductive elastomeric contact modules and biasing modules. The first sides of the conductive elastomeric contact modules interface to the flex film, and the second sides of the conductive elastomeric contact modules interface to a printed circuit board (PCB) set of contacts. The flex film includes conductive traces for providing electrical communication from the first conductive elastomeric contact module to the second conductive elastomeric contact module. The interconnect of the connector, comprising the flex film and the conductive elastomeric contact modules, floats within the housing thereby providing more accurate alignment to a set of oriented circuit board contacts and is isolated from stresses associated with the insertion of the connector to a mating printed circuit board.

BRIEF DESCRIPTION OF THE SEVERAL VIEWS OF THE DRAWING

The invention will be more fully understood from the following detailed description taken in conjunction with the accompanying drawings in which:

FIG. 1A is a top view of the high-speed connector of the present invention;

FIG. 1B is a front view of the connector of FIG. 1A;

FIG. 1C is a bottom view of the connector of FIG. 1A;

FIG. 1D is a perspective view of the connector of FIG. 1A;

FIG. 1E is a cross-sectional side view of the connector of FIG. 1A;

FIG. 2 is an exploded perspective view of the connector of the present invention;

FIG. 3 is a side view of the connector of the present invention including alignment pins;

DETAILED DESCRIPTION OF THE INVENTION

Figure 4:
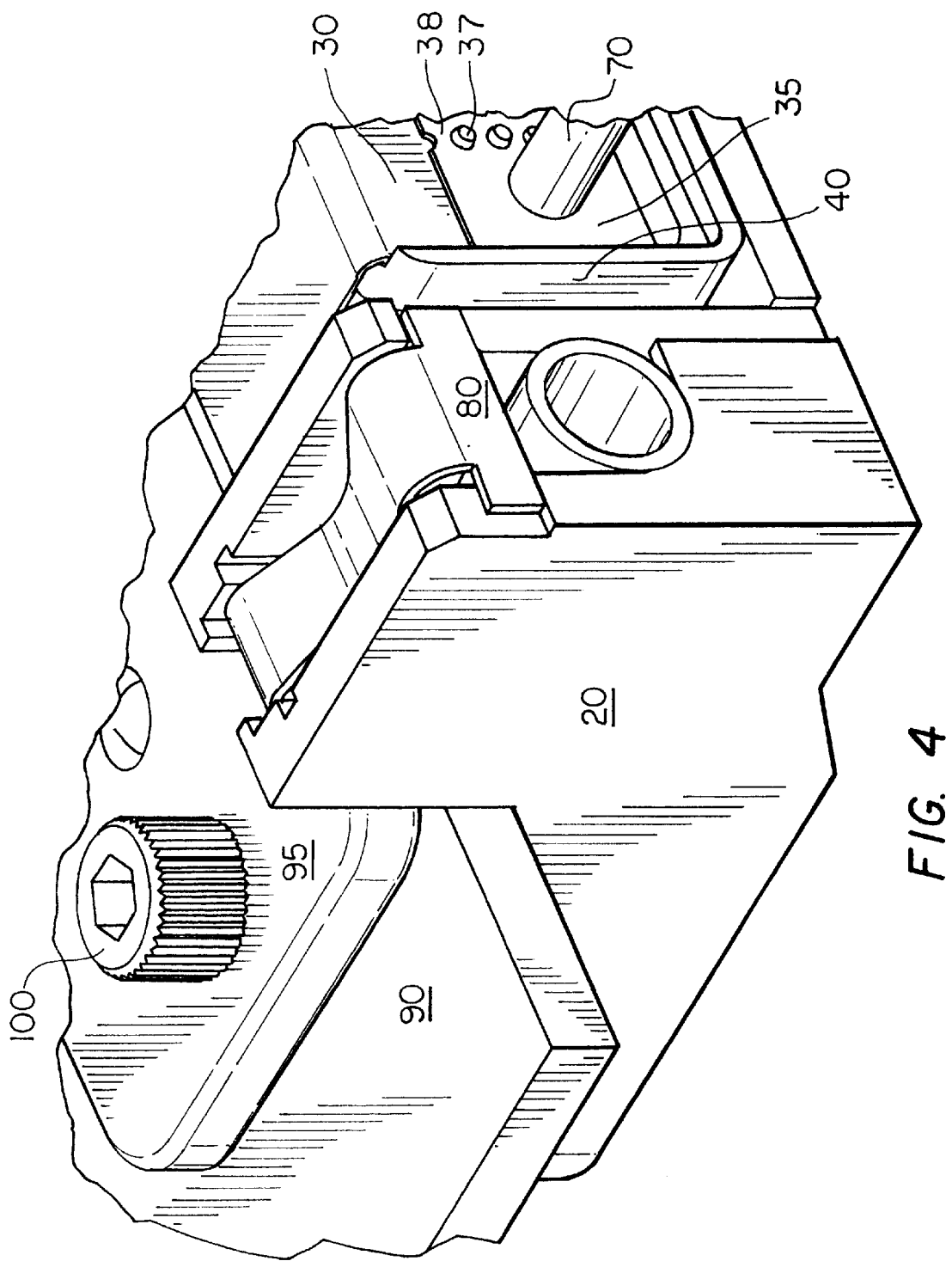
FIG. 4 is a partial perspective view of the connector assembled to a circuit board.

A high-speed connector for interconnecting circuit boards to a backplane or interconnecting a motherboard to daughter board is disclosed. Referring to FIGS. 1A through FIG. 2, the connector 10 includes a housing 20, biasing elements 50 and 60, a flex film 30, conductive elastomeric contact modules 35 (shown in FIG. 4) and biasing modules 40 and 45.

The connector 10 has a front surface 12 and a bottom surface 14. In use, the bottom surface 14 is disposed on a first printed circuit board (PCB), while front conductive surface 12 extends from an end of the first printed circuit board and can be mated to a second printed circuit board such as a backplane or mother board.

Disposed within the housing 20 is the flex film 30. The flex film 30 includes a plurality of conductive traces for providing electrical communication between a first conductive elastomeric contact module 35 located at the front surface 12 of the connector housing 20 and a second similar conductive elastomeric contact module (shown in FIG. 1C) at the bottom surface 14 of the connector housing 20. The flex film 30 may be realized as a multilayer film and include ground planes and/or strip line traces. The ability to support controlled impedance connections is also provided, since ground connections can be made anywhere on the conductive elastomeric contact modules 35 and/or the flex film 30.

The first conductive elastomeric contact module 35 connects to the first end of the flex film 30 and both the first conductive elastomeric module 35 and the first end of the flex film 30 are mounted on an external face of a first biasing module 40. Similarly, the second conductive elastomeric contact module 35 connects to the second end of the flex film 30 and an external face of a second biasing module 45. The first conductive elastomeric contact module 35 is positioned along a first plane, the second conductive elastomeric contact module is positioned along a second plane and the planes are generally perpendicular with respect to each other. In a particular embodiment alignment pins 70 are used to mechanically secure the flex film 30 and conductive elastomeric contact modules to respective biasing modules 40 and 45. In this manner, electrical communication with a plurality of contacts on the surface of a first PCB are provided at generally perpendicular orientation with to the first PCB in order to mate with a second CPB such as a backplane or mother board.

The first side of the conductive elastomeric contact modules interface to the flex film 30, and the second side of the conductive elastomeric contact module interface to a printed circuit board set of contacts. Alternately, the conductive elastomeric contacts could be molded directly onto the flex film to eliminate the conductive elastomeric contact modules (shown in FIG. 2). Further, the conductive elastomeric contact modules could also include power and ground contacts.

A plurality of biasing elements 50 and 60, such as springs, are disposed between the biasing modules 40 and 45 and the housing 20. With such an arrangement the biasing modules 40 and 45, the flex film 30 and the conductive elastomeric contact modules 35, collectively referred to as the interconnect of connector 10, "float" with respect to the housing 20. Accordingly, alignment of the connector 10 to the PCB is centered on the board by capturing of the alignment pins 70 that also serve to secure the conductive elastomeric contact module and flex film to the biasing module. Since the connector interconnect floats within the connector housing, each module aligns individually, thereby improving the reliability while also making installation and removal of the PCB to or from the connector easier.

Figure 5:
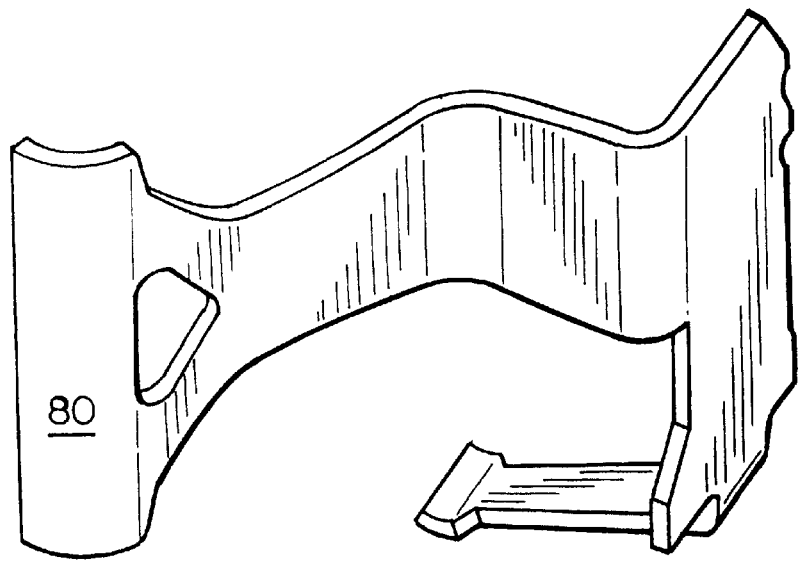
FIG. 5 is a perspective view of a first external contact of the connector of the present invention.
Figure 6:
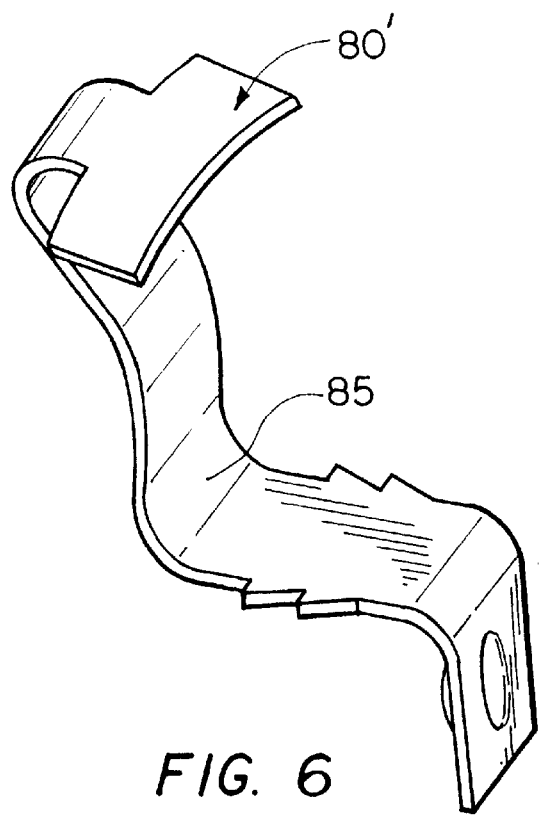
FIG. 6 is a perspective view of a second external contact of the connector of the present invention.

Referring now to FIGS. 4–6, power and ground connections can be made via the conductive elastomeric contact modules 35 or by way of external fasteners 80 and 80' which may be situated in recesses in the housing 20. The connector 10 is shown mechanically secured to a first PCB 90 by way of a backing plate 95. The backing plate 95 is positioned on the underside of the PCB 90 opposite the connector 10. A mechanical fastener 100, such as a bolt, is used to secure the connector housing 10 to the backing plate 95 through the PCB 90.

When the connector 10 is used in a backplane environment, a conventional card cage design may be used, or alternately a custom card cage locking mechanism could be developed. When the connector 10 is mated with a cooperating printed circuit board, the forces applied to the printed circuit board 90 are directed to the connector housing 20 and surrounding mounting members and not the connector interconnect itself. In this manner the floating interconnect is subjected to less mechanical stress and strain and the reliability of the connector is improved. An extendable frame may be utilized to hold multiple connector modules. The connector modules can be stacked vertically or horizontally in the frame. The backplane or motherboard (second PCB) latches or locks in place to the connector 10 with the biasing elements providing the force needed to maintain the electrical connections between the connector and the second PCB, thereby eliminating the need for mounting a fastener behind the second PCB. The second PCB is plugged into the connector 10 from the front and can be latched or locked from either the front or from the back.

Having described preferred embodiments of the invention it will now become apparent to those of ordinary skill in the art that other embodiments incorporating these concepts may be used. Accordingly, it is submitted that the invention should not be limited to the described embodiments but rather should be limited only by the spirit and scope of the appended claims.

We claim:

1. A high-speed backplane connector comprising:

a housing;

a flex film including a plurality of conductive traces, said flex film disposed within said housing;

a first conductive elastomeric contact module having a first side and a second side, said first side in electrical communication with said flex film, said second side capable of interconnection with a printed circuit;

a second conductive elastomeric module having a first side and a second side, said first side in electrical communication with said flex film, said second side capable of interconnection with a printed circuit board, said second elastomeric module in electrical communication with said first elastomeric contact module through said flex film;

a first biasing module attached to a first portion of said flex film;

a second biasing module attached to a second portion of said flex film; and a first biasing element disposed between said housing and said first biasing module and supporting said first biasing module within said housing, and a second biasing element disposed between said housing and said second biasing module and supporting said second biasing module within said housing such that said first and second biasing modules, said first and second conductive elastomeric modules and said flex film float within said housing.

2. The connector of claim 1 wherein said first conductive elastomeric contact module comprises a substrate including a plurality of conductive elastomeric contacts.

3. The connector of claim 1 wherein said second conductive elastomeric contact module comprises a substrate including a plurality of conductive elastomeric contacts.

4. The connector of claim 1 wherein said first conductive elastomeric contact module comprises a polymer including a plurality of conductive elastomeric contacts disposed therein.

5. The connector of claim 1 wherein said second conductive elastomeric contact module comprises a polymer including a plurality of conductive elastomeric contacts disposed therein.

6. The connector of claim 1 wherein said first conductive contact module is integral with said flex film.

7. The connector of claim 1 wherein said second conductive contact module is integral with said flex film.

8. The connector of claim 1 wherein said second side of said first conductive elastomeric module is disposed generally orthogonal to said second side of said second conductive elastomeric module.

9. The connector of claim 1 wherein said first biasing element comprises at least one spring.

10. The connector of claim 1 wherein said second biasing element comprises at least one spring.

11. The connector of claim 1 wherein power and ground connections are made through said flex film.

12. The connector of claim 1 wherein power and ground connections are made through said first conductive elastomeric module and said second conductive elastomeric module.

13. The connector of claim 1 further comprising at least one external contact having a first end and a second end, said first end disposed adjacent said second side of said first conductive elastomeric module, said second end disposed adjacent said second side of said second conductive elastomeric module and wherein a power or ground connection is made through said at least one external contact.

14. The connector of claim 1 wherein said flex film comprises a multilayer flex film.

15. The connector of claim 14 wherein said multilayer flex film includes a ground plane.

16. The connector of claim 14 wherein said multilayer flex film includes a power plane.

17. The connector of claim 1 wherein said flex film includes at least one strip line trace.

18. The connector of claim 1 further comprising at least one alignment pin disposed on the first end of said flex film.

19. The connector of claim 1 further comprising at least one alignment pin disposed on the second end of said flex film.

20. The connector of claim 1 wherein said connector is capable of being mounted to a first side of a printed circuit board, and further comprising:

a backing plate capable of being disposed on a second side of a printed circuit board; and a fastener for mechanically coupling said connector to said backing plate.

21. The connector of claim 20 wherein said fastener comprises a bolt.

* * * * *